United States Patent
Tomita et al.

(10) Patent No.: US 10,070,520 B2
(45) Date of Patent: Sep. 4, 2018

(54) MAGNETIC PARTICLE EMBEDDED FLEX OR PRINTED FLEX FOR MAGNETIC TRAY OR ELECTRO-MAGNETIC CARRIER

(71) Applicant: Intel Corporation, Santa Clara, CA (US)

(72) Inventors: Yoshihiro Tomita, Tsukuba (JP); Joshua D. Heppner, Chandler, AZ (US); Shawna M. Liff, Gilbert, AZ (US); Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 14/998,263

(22) Filed: Dec. 26, 2015

(65) Prior Publication Data
US 2017/0188455 A1    Jun. 29, 2017

(51) Int. Cl.
*H05K 3/00*        (2006.01)
*H05K 1/03*        (2006.01)
(Continued)

(52) U.S. Cl.
CPC .......... *H05K 1/0393* (2013.01); *A41D 1/002* (2013.01); *A41D 13/0015* (2013.01);
(Continued)

(58) Field of Classification Search
CPC ........ H05K 1/0393; H05K 1/03; H05K 1/118; H05K 1/189; H05K 3/007; H05K 2201/08;
(Continued)

(56) References Cited

U.S. PATENT DOCUMENTS

2005/0062360 A1* 3/2005 Yabuta .................... H01L 37/04
310/306
2005/0168141 A1* 8/2005 Henseler ............. H01L 51/0097
313/506
(Continued)

FOREIGN PATENT DOCUMENTS

JP          06064652        3/1994
KR         100998087       12/2010

OTHER PUBLICATIONS

International Search Report and Written Opinion for PCT Patent Application No. PCT/US16/57909 dated Jan. 6, 2017, 11 pgs.
(Continued)

*Primary Examiner* — Hoa C Nguyen
(74) *Attorney, Agent, or Firm* — Schwabe, Williamson & Wyatt, P.C.

(57) ABSTRACT

In accordance with disclosed embodiments, there are provided methods, systems, and apparatuses for implementing a magnetic particle embedded flexible substrate, a printed flexible substrate for a magnetic tray, or an electro-magnetic carrier for magnetized or ferromagnetic flexible substrates. For instance, in accordance with one embodiment, there are means disclosed for fabricating a flexible substrate having one or more electrical interconnects to couple with leads of an electrical device; integrating magnetic particles or ferromagnetic particles into the flexible substrate; supporting the flexible substrate with a carrier plate during one or more manufacturing processes for the flexible substrate, in which the flexible substrate is held flat against the carrier plate by an attractive magnetic force between the magnetic particles or ferromagnetic particles integrated with the flexible substrate and a complementary magnetic attraction of the carrier plate; and removing the flexible substrate from the carrier plate subsequent to completion of the one or more manu-
(Continued)

facturing processes for the flexible substrate. Other related embodiments are disclosed.

18 Claims, 11 Drawing Sheets

(51) Int. Cl.
*H05K 1/11* (2006.01)
*H05K 1/18* (2006.01)
*H05K 3/32* (2006.01)
*A41D 1/00* (2018.01)
*A43B 3/00* (2006.01)
*A41D 13/00* (2006.01)

(52) U.S. Cl.
CPC .......... *A43B 3/0005* (2013.01); *H05K 1/03* (2013.01); *H05K 1/118* (2013.01); *H05K 1/189* (2013.01); *H05K 3/007* (2013.01); *H05K 3/0011* (2013.01); *H05K 3/32* (2013.01); *H05K 2201/0203* (2013.01); *H05K 2201/08* (2013.01)

(58) Field of Classification Search
CPC ....... H05K 2201/083; H05K 2201/086; H05K 13/028; H05K 13/029; H05K 2203/10; H05K 2203/101; H05K 2203/102; H05K 2203/104
See application file for complete search history.

(56) References Cited

U.S. PATENT DOCUMENTS

| | | |
|---|---|---|
| 2012/0111950 A1 | 5/2012 | Worrall et al. |
| 2013/0044215 A1 | 2/2013 | Rothkopf et al. |
| 2013/0095592 A1* | 4/2013 | Koresawa ............ H01L 51/003 438/46 |
| 2014/0308490 A1* | 10/2014 | Burrows .............. C09D 11/037 428/207 |
| 2015/0073201 A1 | 3/2015 | Rogachefsky et al. |
| 2015/0168896 A1* | 6/2015 | Yonekubo .......... G03G 15/2053 399/329 |
| 2015/0270710 A1* | 9/2015 | Carver .................. H02J 7/0024 307/109 |
| 2015/0378391 A1* | 12/2015 | Huitema ................ G06F 1/163 361/679.03 |

OTHER PUBLICATIONS

International Preliminary Report on Patentability for international Patent Application No. PCT/US2016/057909, dated Jul. 5, 2018, 8 pages.

* cited by examiner

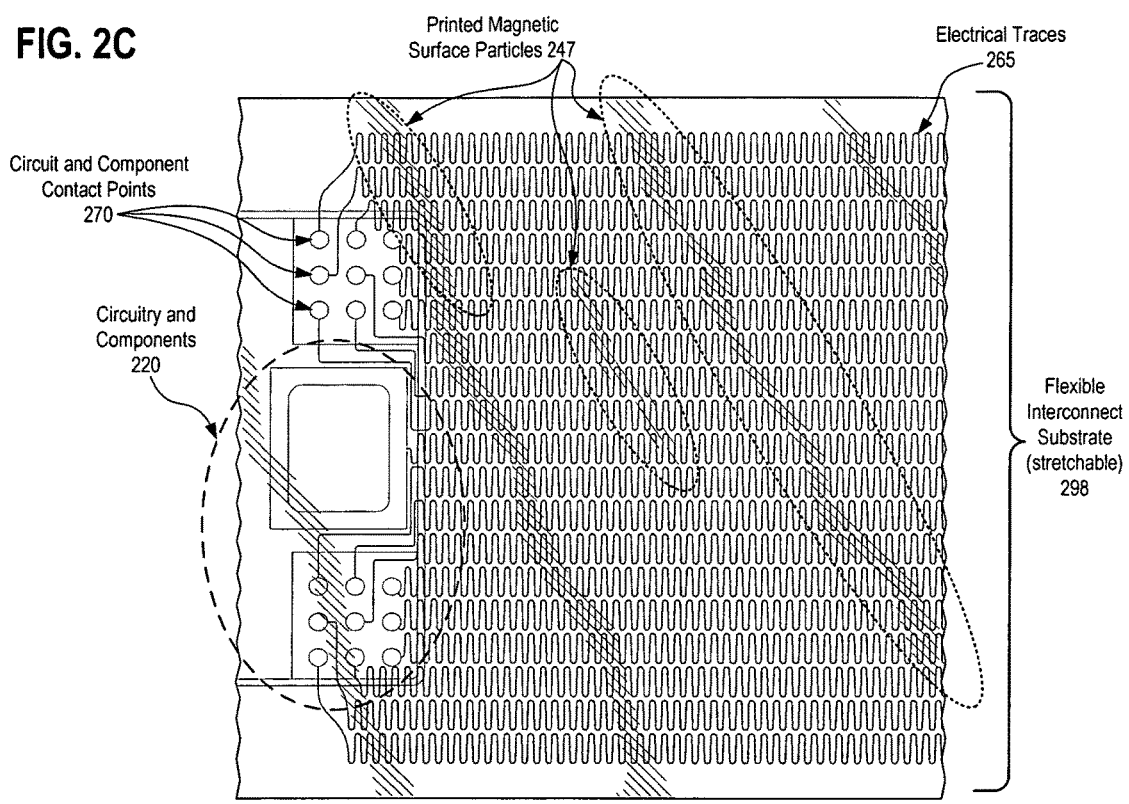

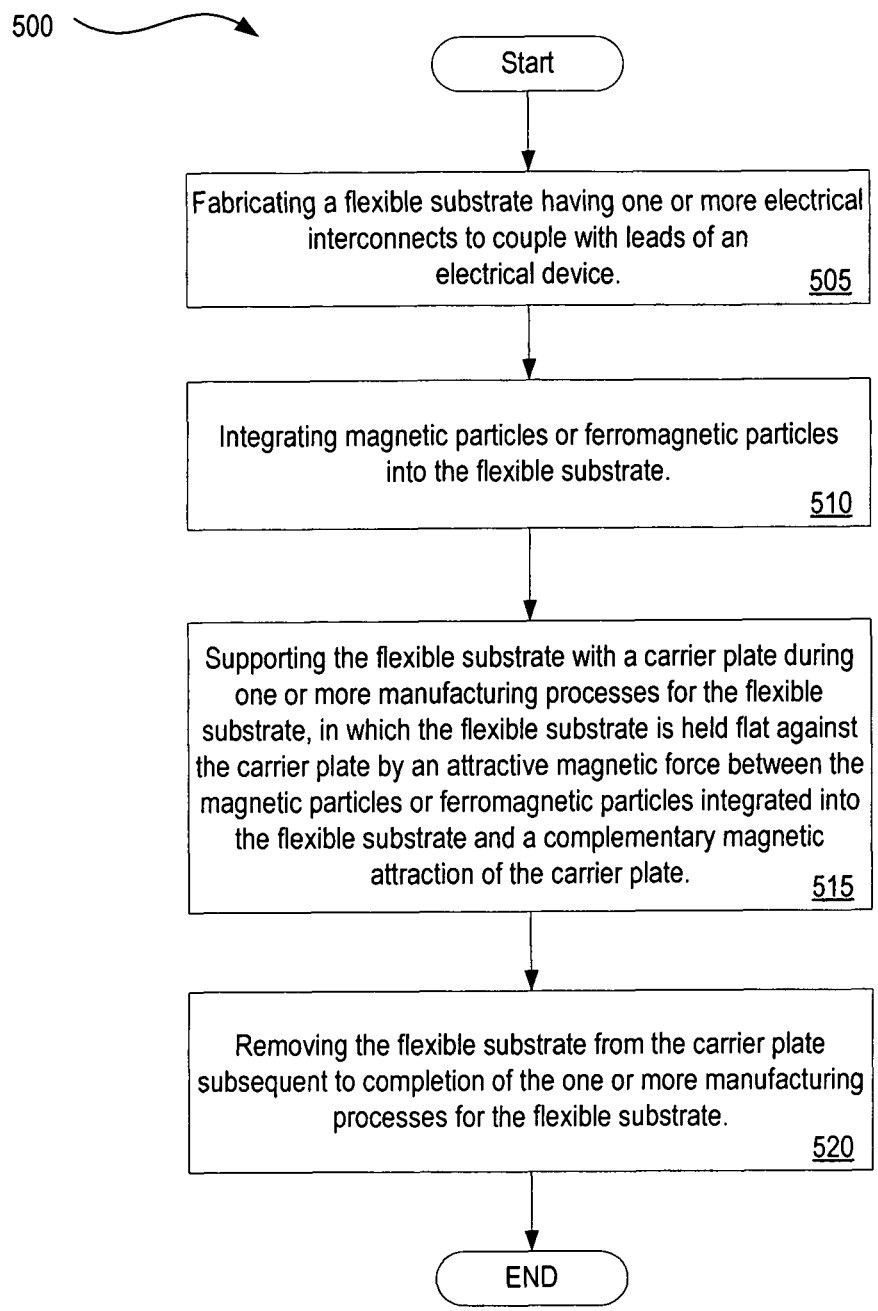

US 10,070,520 B2

MAGNETIC PARTICLE EMBEDDED FLEX OR PRINTED FLEX FOR MAGNETIC TRAY OR ELECTRO-MAGNETIC CARRIER

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, systems, methods, and apparatuses for implementing a magnetic particle embedded flexible substrate, a printed flexible substrate for a magnetic tray, or an electro-magnetic carrier for magnetized or ferromagnetic flexible substrates.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

As modern electronics advance a variety of new use cases and implementations are entering the marketplace including the use of flexible (and sometimes stretchable) electronics for clothing and other wearable devices. This presents a serious problem for manufacturers of such electronics devices, clothing, and so called "wearables" given the simple fact that advanced electronics historically have been made to be ridged. "Wearables," "wearable technology," "fashionable technology," "wearable devices," "tech togs," and "fashion electronics" are all in reference to a class of clothing, garments, and accessories which incorporate computer and advanced electronics technologies into "wearable" pieces, be they clothing or otherwise. Wearable devices such as activity trackers represent a part of the "Internet of Things" or "IoT" as they form part of the network of physical objects or "things" embedded with electronics, software, sensors and connectivity to enable objects to exchange data with a manufacturer, operator and/or other connected devices, without requiring human intervention.

While such wearables commonly have an aesthetic aspect to them, we discuss the functional and technological aspects of wearables herein and more particularly discuss issues pertaining to semiconductor and electronics manufacturing of such wearables.

Fundamentally, as manufacturers of such wearables having these flexible and stretchable substrates embodied therein seek to scale up production processes and lower the cost of manufacturing, there are needed new manufacturing processes for the handling and processing of such flexible and stretchable substrates, just as conventional approaches were developed in years past for the handling and processing of conventional rigid (e.g., inflexible) electronics substrates.

Unfortunately, such conventional approaches are not satisfactory for the handling of flexible and stretchable substrates due to the fragile nature of the materials. For instance, a variety of problems arise when attempting to utilize conventional manufacturing techniques developed for non-flexible substrates with flexible substrates, including the flexible substrates failing to maintain their shape on a carrier, the flexible substrates ripping or tearing, the flexible substrates being blown off of their carrier plates due to even small air currents or drafts, and so forth. Clips, clamps, and mechanical presses used with conventional inflexible substrates have been observed to be especially prone to damaging the soft and fragile materials used in such flexible substrates.

The present state of the art may therefore benefit from the means for implementing a magnetic particle embedded flexible substrate, a printed flexible substrate for a magnetic tray, or an electro-magnetic carrier for magnetized or ferromagnetic flexible substrates as is described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 2C depicts an exemplary flexible interconnect substrate in accordance with described embodiments;

FIG. 5 is a flow diagram illustrating a method for implementing a magnetic particle embedded flexible substrate, a printed flexible substrate for a magnetic tray, or an electro-magnetic carrier for magnetized or ferromagnetic flexible substrates in accordance with described embodiments.

DETAILED DESCRIPTION

Figure 1:
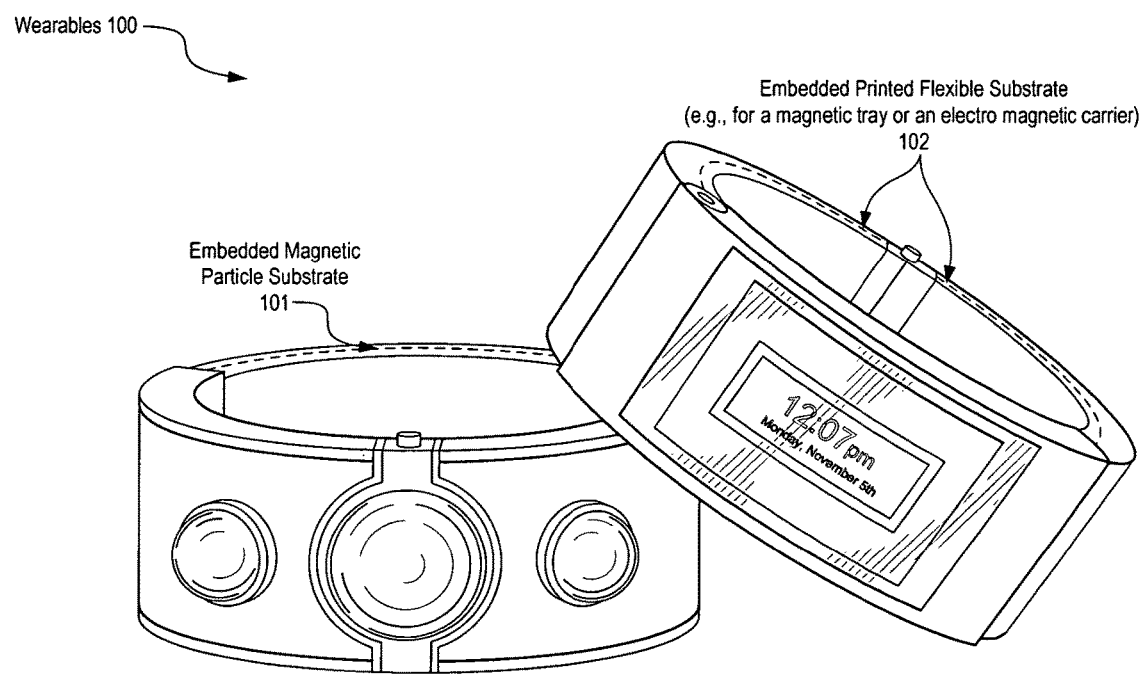
FIG. 1 depicts exemplary wearables in accordance with which embodiments may operate.

Described herein are systems, apparatuses, and methods for implementing a magnetic particle embedded flexible substrate, a printed flexible substrate for a magnetic tray, or an electro-magnetic carrier for magnetized or ferromagnetic flexible substrates. For instance, in accordance with one embodiment, there are means disclosed for fabricating a flexible substrate having one or more electrical interconnects to couple with leads of an electrical device; integrating magnetic particles or ferromagnetic particles into the flexible substrate; supporting the flexible substrate with a carrier plate during one or more manufacturing processes for the flexible substrate, in which the flexible substrate is held flat against the carrier plate by an attractive magnetic force between the magnetic particles or ferromagnetic particles integrated with the flexible substrate and a complementary magnetic attraction of the carrier plate; and removing the flexible substrate from the carrier plate subsequent to completion of the one or more manufacturing processes for the flexible substrate.

Flexible electronics, also known as flex circuits represent an area of technology for assembling electronic circuits by mounting electronic devices on flexible plastic substrates, as well as related flexible and stretchable electronics which serve the same function but permit some elasticity as well. Such flexible and flexible-stretchable electronics utilize substrate materials including, for example, a stretchable dielectric material (e.g., a stretchable material which acts as an electrical insulator and can be polarized by an applied electric field), a compliant (e.g., bendable, flexible) dielectric material, a stretchable and bendable dielectric material, etc. For instance, such materials may be formed from polyimide substrates, PEEK substrates (e.g., PolyEther Ether Ketone, a colorless organic thermoplastic polymer), PDMS substrates (e.g., PolyDiMethylSiloxane and also called dimethicone, one of a group of polymeric organosilicon compounds), silicon-based organic polymer substrates, transparent conductive polyester films and substrates, stretchable polydimethylsiloxane (PDMS) substrates, stretchable Polyisoprene substrates, stretchable polybutadiene substrates, stretchable polyisobutylene substrates, stretchable polyurethanes substrates, stretchable thermoplasticpolyurethanes substrates, stretchable butyl rubber substrates, stretchable nitrile rubber substrates, stretchable woven fabric substrates, and screen printed silver circuits on polyester substrate materials.

Such flexible electronic assemblies may be manufactured using identical components used for rigid printed circuit boards, allowing the board to conform to a desired shape, or to flex during its use, however, the underlying substrate has unique properties (such as thinness, flexibility, stretchability) which are beneficial to the wearables field of technologies but for which the conventional manufacturing processes are no longer satisfactory or even feasible in certain instances.

Certain Flexible Printed Circuits (FPCs) are made with a photolithographic technology or embodied within flexible foil circuits or Flexible Flat Cables (FFCs) by laminating very thin (e.g., 0.07 mm) copper strips between two layers of Polyethylene terephthalate (PET, PETE) which are then coated with thermosetting adhesive activated and cured during lamination.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

FIG. 1 depicts exemplary wearables 100 in accordance with which embodiments may operate. More particularly, there are depicted wearables 100, each of which has embodied therein a flexible substrate. The wearable 100 on the left has embedded therein a magnetic particle substrate 101 and the wearable on the right has embedded therein a printed flexible substrate 102 such as that which will self-attract to a magnetic tray or an electro magnetic carrier through electromagnetic attraction in accordance with the embodiments as set forth herein.

Such flexible electronics provide tightly assembled electronic packages for both static electronics but which require electrical connections in 3 axes, thus making the flexibility of the electronics advantageous for both manufacturing and assembly of such products, as well as dynamic electronics applications such movable electronics for which the electronics and electrical connections are required to flex and/or stretch during manufacture, assembly, as well as during their intended use by consumers.

In a related embodiment there is a wearable technology to be worn as a clothing item or an accessory, in which the wearable technology includes at least an integrated circuit on a flexible substrate, a stretchable substrate, or a flexible and stretchable substrate.

In accordance with such an embodiment, the wearable technology is embodied within one of: a clothing item; sports attire; a shoe; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

Figure 2A:
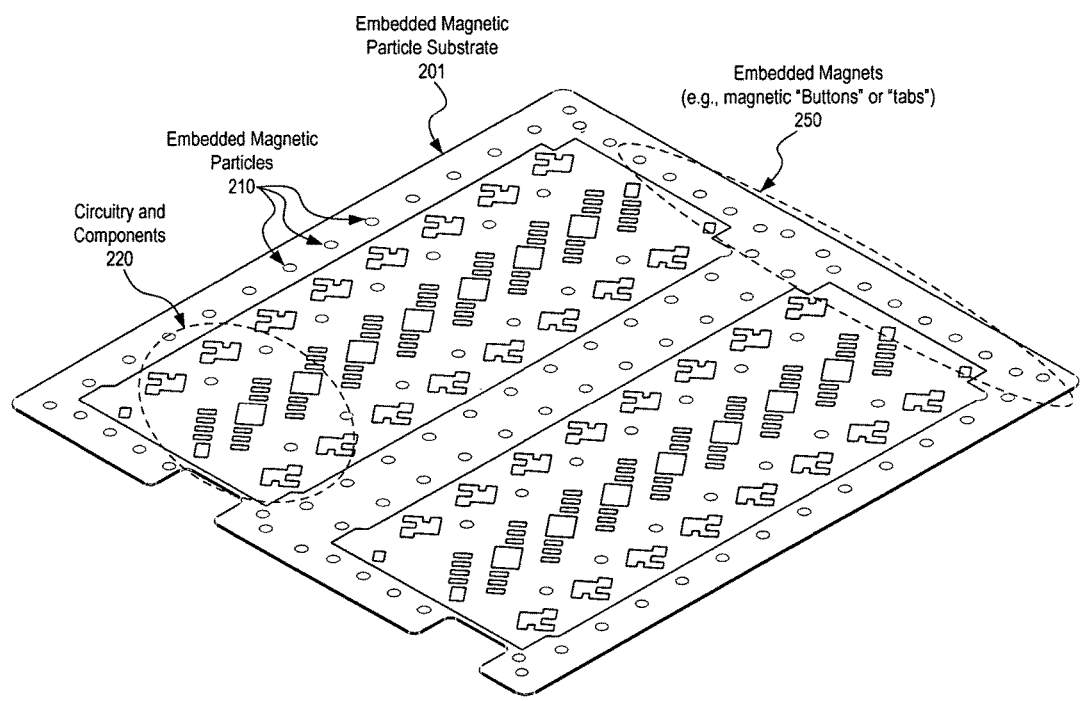
FIG. 2A depicts exemplary embedded magnetic particle substrate in accordance with described embodiments.

FIG. 2A depicts exemplary embedded magnetic particle substrate 201 in accordance with described embodiments. In particular, there is the depicted an embedded magnetic particle substrate 201 having thereupon or integrated therein the depicted circuitry and components 220. Further depicted are the magnetic particles 210 which are mixed into and cured with the embedded magnetic particle substrate 201 and thus form part of the embedded magnetic particle substrate 201 and specifically serve the function of making the substrate magnetic. Also depicted as an alternative embodiment are embedded magnets 250 (e.g., embedded magnetic "buttons" or "tabs") within the embedded magnetic particle substrate 201. Either the embedded magnetic particles 210 or the embedded magnets 250, or both, may be utilized in accordance with the described embodiments.

Figure 2B:
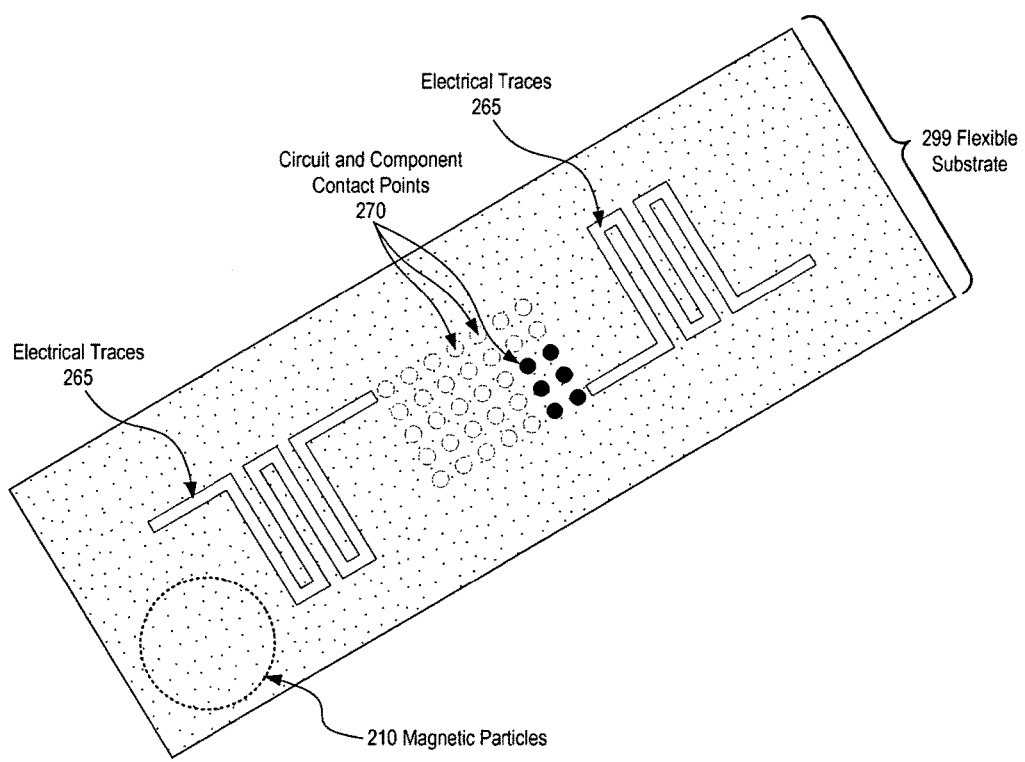
FIG. 2B depicts an exemplary flexible substrate in accordance with described embodiments.

FIG. 2B depicts an exemplary flexible substrate 299 in accordance with described embodiments. In particular, there is depicted the flexible substrate 299 having embedded therein magnetic particles 210 as well as electrical traces 265 and circuit and component contact points 270, each of which provide interconnectivity through flexible substrate 299 for a variety of components and circuitry to be integrated into or onto the flexible substrate 299.

FIG. 2C depicts an exemplary flexible interconnect substrate 298 in accordance with described embodiments. The flexible interconnect substrate 298 depicted is both flexible and stretchable in accordance with such embodiments, having electrical traces 265 embedded therein which are capable of expanding and contracting as the elasticity of the flexible interconnect substrate 298 yields to pulling forces and re-contracts under its elastic force. Such a material is useful in wearables which are integrated into clothing, such as sports attire having sensors and other functional components integrated therein. Further depicted are the circuit and component contact points 270 as well as circuitry and components 220 which are interconnected with both the contact points and also the electrical traces 265 of the flexible interconnect substrate 298.

Notably, there is depicted the flexible interconnect substrate 298 having printed magnetic surface particles 247 printed, coated, or painted thereupon, in accordance with described embodiments, the printed magnetic surface particles 247 provide the flexible interconnect substrate 298 with an electromagnetic attractive force.

During the manufacturing process for electronics, such as the magnetic particle substrate 201 which is depicted at FIG. 2A, the flexible substrate 299 depicted at FIG. 2B, and the flexible interconnect substrate 298 depicted at FIG. 2C, it is necessary to utilize handling medias referred to as carriers or carrier plates or captive carrier plates, etc. These carrier plates are necessary due to the inherent thinness, flexibility, and fragility of the flexible substrate materials (e.g., 201, 298, and 299). The flexible substrates are very thin, similar to paper, and as such, the material simply does not hold its shape naturally when placed upon or place within such a carrier.

While it is desired that the flexible electronics bend easily during their eventual use in dynamic consumer electronics and wearables, it is not desirable for them to bend, curl, or twist, etc., during the actual manufacturing process.

Conventional manufacturing techniques include clipping or clamping the materials to a carrier plate, however, these methodologies tend to rip, tear, or otherwise damage the fragile substrate materials. Simply allowing the flexible substrates to lie upon a carrier plate during the manufacturing process is likewise ineffective because they tend to curl, bend, warp, or even crinkle when the substrates are subjected to thermal curing processes, or even blow away when subjected to blown nitrogen and other chemical blowing agents which are common to such flexible substrate manufacturing techniques.

Another approach has been to tape the flexible electronics to the carrier plate, but this creates additional problems as adhesive residue remains behind on the flexible substrate which is problematic and difficult to remove, often requiring additional chemical processing and therefore increased costs, environmental hazard, and waste.

Still further, the carrier plates then have adhesive residue which similarly requires cleaning and thus adds cost, complexity, and wasted manufacturing resources. Yet another approach has been to tape the flexible electronics to a carrier plate using flanges or handling zones of the flexible electronics which do not form part of the end product, and then these flanges or handling zones are cut away, thus negating the need to clean the adhesive residue from the flexible electronics manufactured. While this has some benefit, there is the obvious disadvantage of increased manufacturing processes (e.g., the removal of the flanges) as well as waste as the flanges and handling zones are simply discarded, and wholly fails to address the problem of the adhesive residue which is left upon the carrier plates.

Certain manufacturing processes require a heating of the flexible substrate materials (e.g., 201, 298, and 299) which causes them to expand which causes still further damage to the flexible substrate materials (e.g., 201, 298, and 299) if they are mechanically bound to a carrier plate as the expanding and contracting can induce material warping, tearing, or simply separation from the mechanical clips, clamps, tape, or whatever means are being utilized to mechanically bound the flexible substrate materials (e.g., 201, 298, and 299) to the carrier plates.

Therefore, in accordance with the embodiments described herein, the flexible substrate materials (e.g., 201, 298, and 299) are made to be held to the carrier plates by way of magnetic attraction between the carrier plates and the flexible substrate materials (e.g., 201, 298, and 299). For instance, as is depicted with regard to each of flexible substrate materials 201, 298, and 299, the magnetic particles may be embedded within the flexible substrate materials (e.g., 201, 298, and 299) such that they will hold fast to a carrier plate through their mutual magnetic attraction. Alternatively, the flexible substrate materials (e.g., 201, 298, and 299) can have ferrous materials embedded therein such that they themselves are not magnetic, yet will nevertheless hold fast to a carrier plate which is magnetic.

Regardless of whether the flexible substrate materials (e.g., 201, 298, and 299) are made to be magnetic through magnetic particles being integrated, printed, coated, or painted thereon, or the flexible substrate materials (e.g., 201, 298, and 299) having ferrous materials integrated therein such that they are attracted to a magnetic force, use of the flexible substrate materials (e.g., 201, 298, and 299) with carrier plates where the holding means is through electromagnetic forces greatly improves the manufacturability of the flexible substrate materials (e.g., 201, 298, and 299) as it is no longer necessary to utilize mechanical holding means such as clips and clamps which damage the substrates, nor is it necessary to utilize tapes and adhesives which contaminate the substrates with adhesive residue and introduce more costly and complex manufacturing processes. Still further, the flexible substrate materials (e.g., 201, 298, and 299) are not inclined to warp, curve, curl, twist, or blow away, because the substrates are held with sufficient force to the carrier plate and further because the magnetic attraction between the carrier plate and the flexible substrate materials (e.g., 201, 298, and 299) can be made with the attractive force distributed over a large portion or the entirety of their surface area.

Because there is no tape or cover plate required for the manufacture of the flexible substrate materials (e.g., 201, 298, and 299) as described, it is possible to immediately advance the flexible substrate materials (e.g., 201, 298, and 299) through the conventional processes once the flexible substrate materials (e.g., 201, 298, and 299) are held fast to the carrier plate by magnetic force. Conversely, tape requires cleaning, clips and clamps require removal, cover plates require another automatic robotic process to remove the top plate or cover plate, etc. The flexible substrate materials (e.g., 201, 298, and 299) held to the carrier plate by way of magnetic attraction, however, can traverse the manufacturing line as though they were conventional rigid PCB (printed circuit boards) as the carrier plate supports the flexible substrate materials (e.g., 201, 298, and 299) the with requisite rigidity needed by such conventional processes.

Figure 3A:
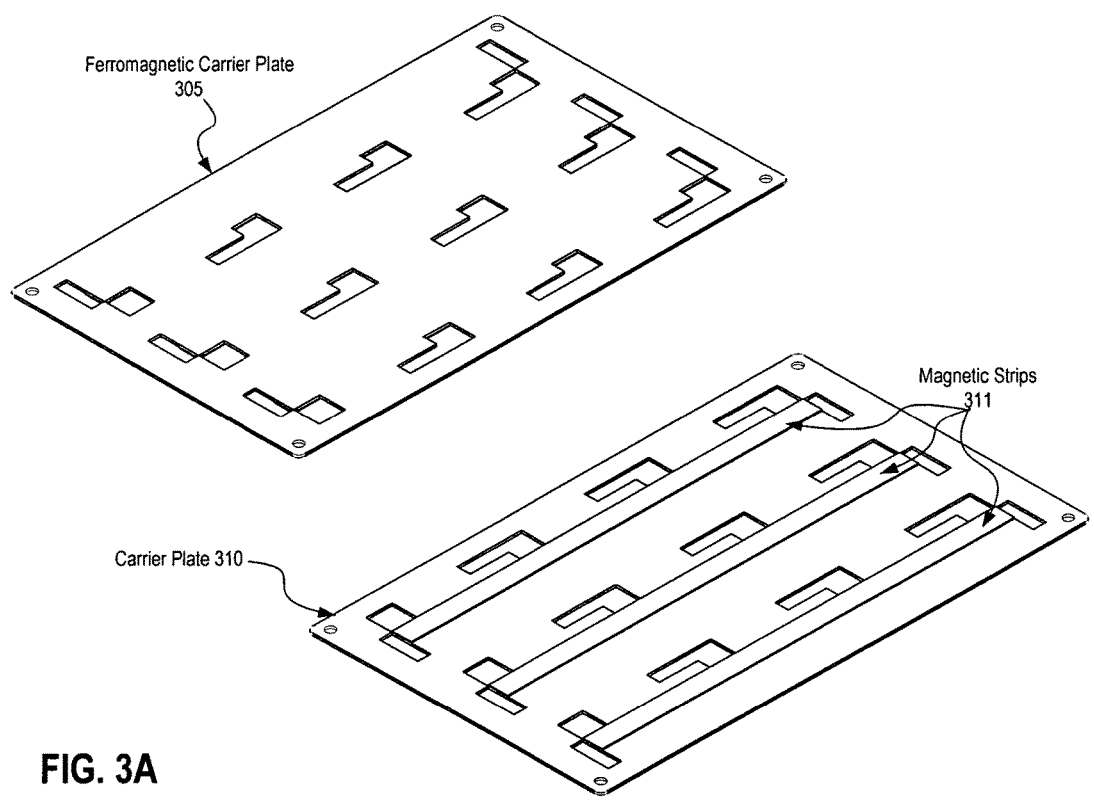
FIG. 3A depicts exemplary carrier plates in accordance with described embodiments.

FIG. 3A depicts exemplary carrier plates in accordance with described embodiments. In particular, there is depicted a ferromagnetic carrier plate 305 at the top left which is not itself magnetic, but strongly attracts to any object which is magnetic, such as the flexible substrate materials (e.g., 201, 298, and 299) having magnetic particles integrated therein or magnetic particles printed, painted, or coated thereupon. Depicted at the bottom right is a carrier plate 310 having been adapted with magnetic strips 311 such that it may receive and hold fast to the flexible substrate materials (e.g., 201, 298, and 299) with magnetic particles integrated therein or magnetic particles printed, painted, or coated thereupon.

Figure 3B:
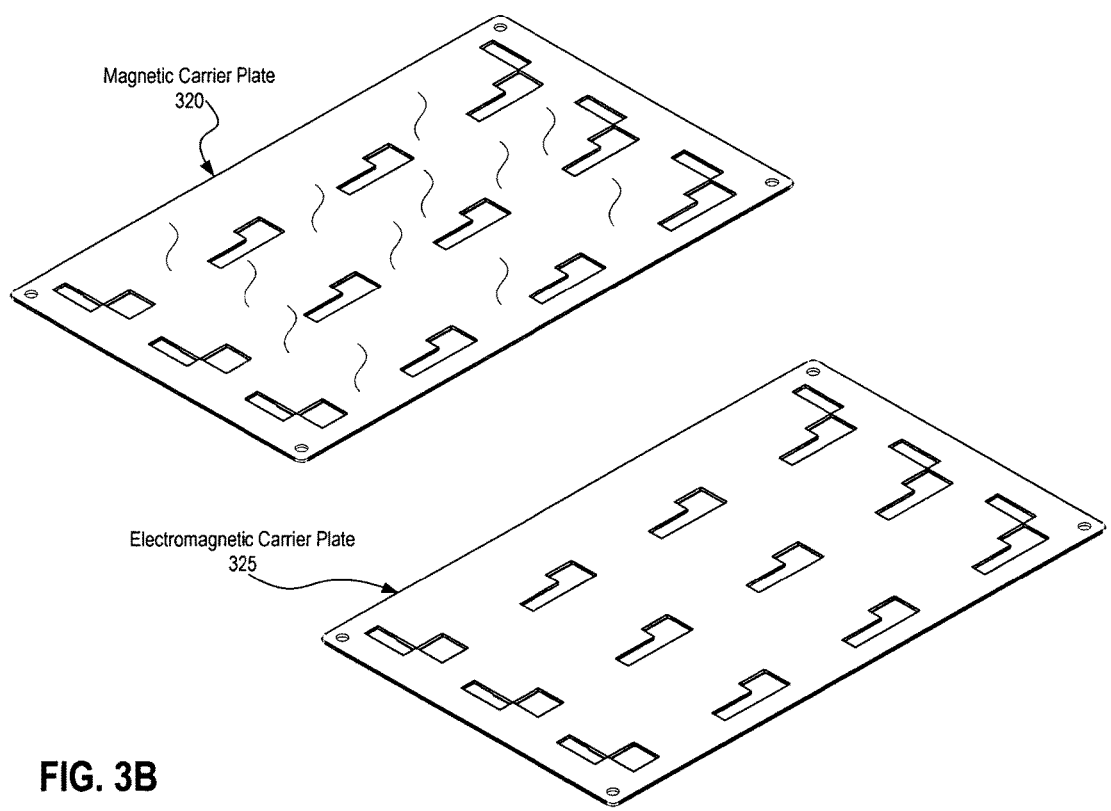
FIG. 3B depicts alternative exemplary carrier plates in accordance with described embodiments.

FIG. 3B depicts alternative exemplary carrier plates in accordance with described embodiments. In particular, there is depicted a magnetic carrier plate 320 at the top left which is itself magnetic and will therefore receive and hold fast by magnetic attraction to the flexible substrate materials (e.g., 201, 298, and 299) with magnetic particles integrated therein or magnetic particles printed, painted, or coated thereupon or to flexible substrate materials (e.g., 201, 298, and 299) with ferrous particles embedded therein or printed, painted, or coated thereupon. Depicted at the bottom right is an electromagnetic carrier plate 325 which permits the magnetic force to be "turned on" when electricity is applied and the electromagnetic carrier plate 325 will therefore receive and hold fast by magnetic attraction to the flexible substrate materials (e.g., 201, 298, and 299) with magnetic particles integrated therein or magnetic particles printed, painted, or coated thereupon or to flexible substrate materials (e.g., 201, 298, and 299) with ferrous particles embedded therein or printed, painted, or coated thereupon. Conveniently, the electromagnetic carrier plate 325 additionally permits the magnetic force to be "turned off" when electricity source is removed, which then makes for easier removal of the flexible substrate materials (e.g., 201, 298, and 299) from the electromagnetic carrier plate 325.

It is therefore in accordance with one embodiment that the flexible substrate materials (e.g., 201, 298, and 299) are prepared on a magnetic plate, such as magnetic plates 310, 320 or 325, such that the flexible substrate materials (e.g., 201, 298, and 299) remain fixed upon the magnetic plate. In accordance with such an embodiment, a cover plate is not required nor is a cover plate used as the flexible substrate materials (e.g., 201, 298, and 299) hold fast to the carrier plate without requiring additional downward pressure from the cover plate. Further still, adhesives are not utilized nor are mechanical binders such as clips or clamps used, as the flexible substrate materials (e.g., 201, 298, and 299) will hold fast to the carrier plate via magnetism without such adhesive or mechanical means.

In a related embodiment, the substrate materials (e.g., 201, 298, and 299) are made with magnetic particles and a ferromagnetic carrier plate 305 is utilized rather than a magnetic carrier plate. With the ferromagnetic carrier plate 305, similar to the magnetic carrier plate, the flexible substrate materials (e.g., 201, 298, and 299) having the magnetic particles embedded therein or coated, printed, or painted thereupon, are prepared on the ferromagnetic carrier plate 305, such that the flexible substrate materials remain fixed upon the ferromagnetic carrier plate 305. As before, tapes, adhesives, cover plates, and mechanical binders are not required and are not utilized.

In accordance with a particular embodiment, the flexible substrate materials (e.g., 201, 298, and 299) are manufactured with the magnetic particles or the ferrous particles embedded or coated on so called "streets" (strips lengthwise along the flexible substrates being manufactured) which are connected with and form part of the flexible substrate materials during manufacturing so as to hold the flexible substrate materials to the carrier plates as described, and at the conclusion of manufacturing, the strips or "streets" are cut away and do not form any part of the consumer product within which the flexible substrates are integrated. Such streets or strips may form either a perimeter or a boarder all the way around the flexible substrate, which is later cut away, or form margins on one two or three sides of the flexible substrate, again, to be cut away later at the conclusion of the manufacturing processes for the flexible substrate. The strips or streets need not be straight and may therefore form the boarder or perimeter of an elliptical or other shaped flexible substrate according to the needs of the manufacturer.

In accordance with a particular embodiment, the flexible substrate materials include the strips or streets and the ferrous or magnetic particles are embodied within or applied to only the strip or street section of the substrate material and are not embodied within or applied to the flexible substrate having the components and circuitry and which ultimately is to be integrated into a consumer product. In such a way, if the consumer product has design specifications, uses, or characteristics which make it preferable to avoid the inclusion of such magnetic or ferrous materials, then the described processes may nevertheless be utilized, but without necessitating the inclusion of such magnetic or ferromagnetic particles in the end product as a result of the described processes for holding the flexible substrates to the carrier plates by way of magnetic forces.

In accordance with a particular embodiment, only a subset or a portion or a zone of the carrier plate is made to be magnetic or ferromagnetic, for instance, such as the magnetic strips 311 which are depicted or alternatively, strips or portions or regions which align with and interface to complementary portions of the flexible substrate, such the strips or streets which are described above.

Figure 4A:
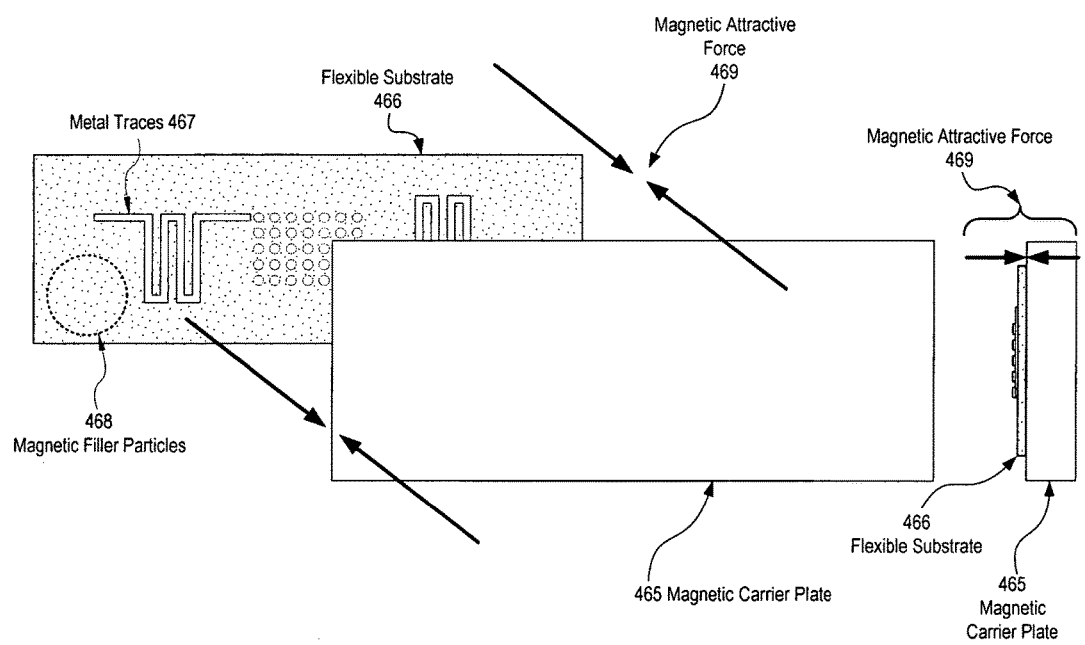
FIG. 4A depicts a flexible substrate and a magnetic carrier plate in accordance with described embodiments.

FIG. 4A depicts a flexible substrate 466 and a magnetic carrier plate 465 in accordance with described embodiments. In Particular, there is a flexible substrate 466 depicted having magnetic filler particles 468 within the substrate material. Also depicted are metal traces 467 and contact points for interconnecting various components and circuits to be installed upon the flexible substrate 466.

There is depicted a magnetic attractive force 469 between the flexible substrate 466 and the magnetic carrier plate 465 by which the flexible substrate 466 is held fast to the magnetic carrier plate 465 during the manufacturing processes. A profile view of the flexible substrate 466 and the magnetic carrier plate 465 is further depicted on the far right hand side, however, the elements shown are the same.

In accordance with a particular embodiment the magnetic characteristics, be they magnetic particles or ferrous particles attracted to magnetic forces, are embodied into the flexible substrate 466 though a buildup process, for instance, as part of a laminated sheet affixed to the flexible substrate or as part of a laminatable sheet to be applied to the flexible substrate 466. Various elements may be incorporated into the flexible substrate as part of the manufacturing processes to build up the flexible substrate, and any or all of these may be adapted to receive the magnetic particles or ferrous particles attracted to magnetic forces such that the resultant flexible substrate embodies the magnetic particles or ferrous particles attracted to magnetic forces and is attracted to the carrier plate in the manner which is described herein.

For instance, as part of the buildup of the flexible substrate 466 or the strips or "streets" attached to the flexible substrate 466 a variety of laminates may be used, any of which may incorporate the magnetic particles or ferrous particles attracted to magnetic forces. Still further, the adhesives utilized to bond the various laminate layers together (not adhesive or tape to bond to the carrier plate but part of the flexible substrate itself) may be adapted with the magnetic particles or ferrous particles attracted to magnetic forces such that when the adhesives are applied as part of the laminate and buildup processes the flexible substrate is as a result made to be magnetic or made to be attracted to magnetic forces due to the incorporation of the magnetic particles or ferrous particles within such adhesives.

In a particular embodiment the magnetic particles or ferrous particles attracted to magnetic forces are incorporated into a solder mask, solder stop mask, or a solder resist layer, which is the thin lacquer-like layer of polymer commonly applied atop the electrical metal traces 467 and interconnecting circuits for protection against oxidation and to prevent solder bridges (an unintended electrical connection between two conductors) from forming between the closely spaced solder pads and contact points.

In accordance with one embodiment, the flexible substrate 466 having magnetic particles or ferrous particles embodied therein is formed into a wearable electronic device, such as a ring, watch, bracelet, belt, clothing, etc., and the magnetic properties of the flexible substrate 466 are then utilized as part of a magnetic coupling means of the wearable electronic device. For instance, a clasp or latch, or other magnetic coupling means may be integrated into the wearable electronic device in such a way that it holds its closed position by attractive magnetic forces exerted by the flexible substrate 466. Consider for instance the watch and bracelet wearable electronic devices depicted at FIG. 1, having a clasp or other magnetic coupler which remains closed through attractive magnetic forces with magnetic filler particles 468 within the substrate material thus eliminating the need for another magnetic force within the design, saving cost, space, and reducing waste.

Figure 4B:
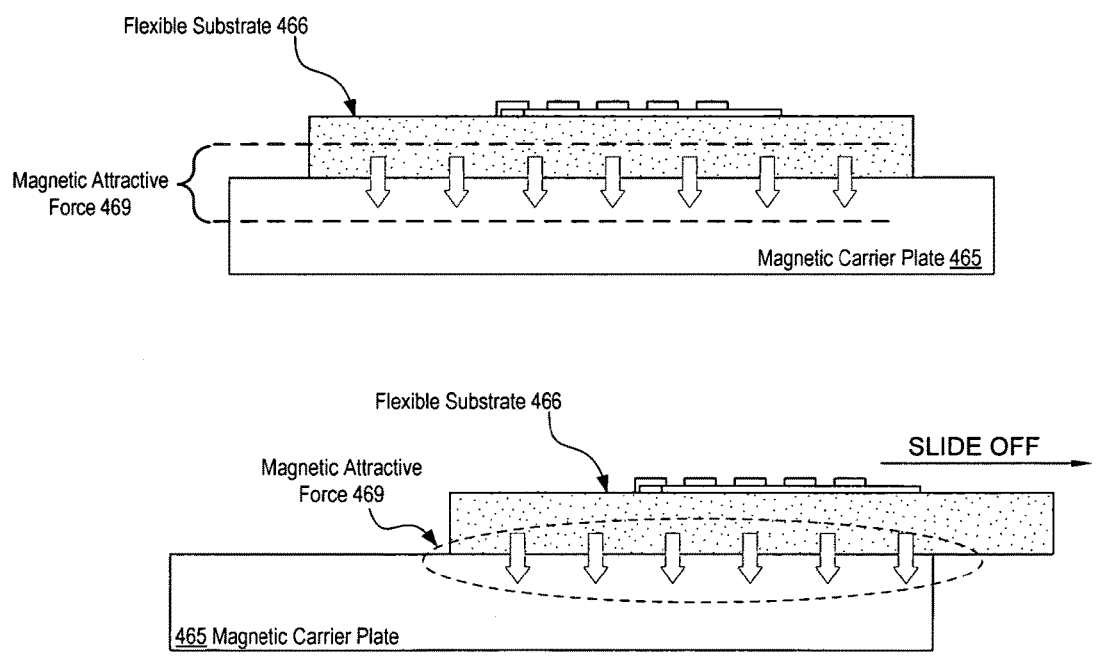
FIG. 4B depicts another flexible substrate and a magnetic carrier plate in accordance with described embodiments.

FIG. 4B depicts another flexible substrate 466 and a magnetic carrier plate 465 in accordance with described embodiments. In particular, the flexible substrate 466 is shown in the top view as being attached to and held fast with the magnetic carrier plate 465 by the magnetic attractive force 469. At the bottom view the removal process for the flexible substrate 466 from the magnetic carrier plate 465 is shown in which the method by which the flexible substrate 466 is removed is to simply slide the flexible substrate 466 off of the magnetic carrier plate 465 in accordance with such an embodiment. According to another embodiment, the flexible substrate is peeled off of the magnetic carrier plate 465 rather than sliding the magnetic carrier plate 465 off of the carrier plate.

In accordance with another embodiment the magnetic force is varied at the magnetic carrier plate 465 to optimize the removal of the flexible substrate 466 by heating or cooling the magnetic carrier plate 465 to attain the desired magnetic force for the removal of the flexible substrate 466.

Figure 4C:
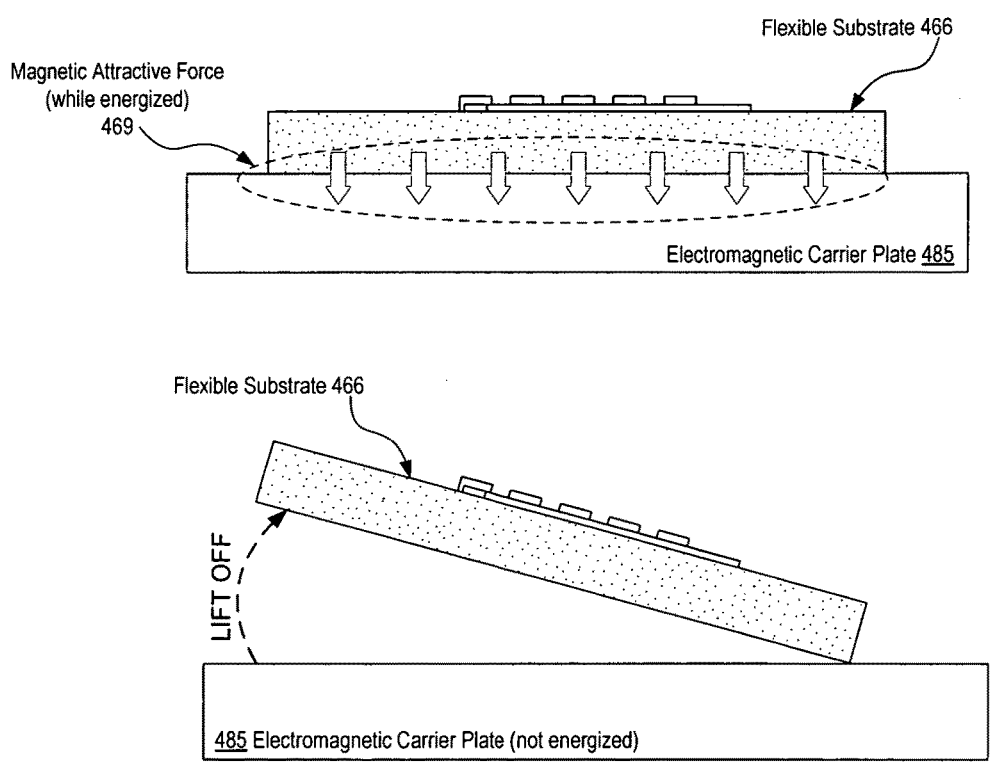
FIG. 4C depicts a flexible substrate and an electromagnetic carrier plate in accordance with described embodiments.

FIG. 4C depicts a flexible substrate 466 and an electromagnetic carrier plate 485 in accordance with described embodiments. In particular, the flexible substrate 466 is shown in the top view as being attached to and held fast with the electromagnetic carrier plate 485 by the magnetic attractive force 469 while the electromagnetic carrier plate 485 is energized by an electrical input source (e.g., while the electromagnetic carrier plate 485 is "turned on"). At the bottom view the removal process for the flexible substrate 466 from the electromagnetic carrier plate 485 is shown in which the method by which the flexible substrate 466 is removed is to simply lift off the flexible substrate 466 from the electromagnetic carrier plate 485 once the electromagnetic carrier plate 485 is no loner energized, in accordance with such an embodiment.

In accordance with another embodiment the electromagnetic force is varied at the electromagnetic carrier plate 485 to optimize the removal of the flexible substrate 466 without entirely de-energizing (e.g., "turning off") the electromagnetic carrier plate 485.

According to the described embodiments, the magnetic particles used as filler or used as a composite or alloy from which the magnetic carrier plate is constructed may be any one of a rubberized magnetic material, a high temperature resistant magnetic material which resists de-magnetizing at high temperatures so as to support thermal curing of the flexible substrates without damaging the magnetic carrier plate used during the manufacturing process, magnetized adhesives, magnetized laminates, magnetized sheets, magnetized filler particles, magnetized tape, magnetic ceramics, SmCo or Neodymium Iron Boron (NdFeB) filler particles, tabs, strips, buttons, etc.

FIG. 5 is a flow diagram illustrating a method 500 for implementing a magnetic particle embedded flexible substrate, a printed flexible substrate for a magnetic tray, or an electro-magnetic carrier for magnetized or ferromagnetic flexible substrates in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 500 may be utilized in a variety of combinations.

At block 505 the method includes fabricating a flexible substrate having one or more electrical interconnects to couple with leads of an electrical device.

At block 510 the method includes integrating magnetic particles or ferromagnetic particles with the flexible substrate.

At block 515 the method includes supporting the flexible substrate with a carrier plate during one or more manufacturing processes for the flexible substrate, in which the flexible substrate is held flat against the carrier plate by an attractive magnetic force between the magnetic particles or ferromagnetic particles integrated with the flexible substrate and a complementary magnetic attraction of the carrier plate.

At block 520 the method includes removing the flexible substrate from the carrier plate subsequent to completion of the one or more manufacturing processes for the flexible substrate.

In accordance with another embodiment of method 500, supporting the flexible substrate with the carrier plate during the one or more manufacturing processes for the flexible substrate includes: supporting the flexible substrate with the carrier plate during one or more of assembly processing operations, semi-conductor manufacturing processes, substrate manufacturing processes, or flexible substrate thermal curing processes, flexible substrate build-up and lamination processes, flexible substrate soldering processes, and flexible substrate functional testing processes.

In accordance with another embodiment of method 500, the flexible substrate for the electrical device lacks sufficient rigidity and biaxial strength to hold its shape within a horizontal plane when unsupported by the carrier plate.

In accordance with another embodiment of method 500, the flexible substrate for the electrical device is sufficiently thin that it does not maintain its shape within a horizontal plane when removed from the carrier plate.

In accordance with another embodiment of method 500, integrating magnetic particles or ferromagnetic particles with the flexible substrate includes one of: integrating magnetized adhesives between laminates of the fabricated flexible substrate; integrating magnetized laminates into the fabricated flexible substrate; integrating magnetized sheets into the fabricated flexible substrate; integrating magnetized filler particles into the fabricated flexible substrate; integrating magnetized tape into the fabricated flexible substrate; integrating magnetic ceramics into the fabricated flexible substrate; integrating SmCo or Neodymium Iron Boron (NdFeB) or SiO2 (Silicon dioxide) or ferrous oxide filler particles into the fabricated flexible substrate; or integrating magnetic or ferromagnetic tabs, strips, or buttons into the fabricated flexible substrate.

In accordance with another embodiment of method 500, integrating magnetic particles or ferromagnetic particles with the flexible substrate includes one of: printing magnetic ink or ferromagnetic ink onto the flexible substrate; painting the flexible substrate with magnetic paint or ferromagnetic paint; coating the flexible substrate with a magnetic or ferromagnetic laminate; coating the flexible substrate with a magnetic or ferromagnetic adhesive; coating the flexible substrate with a magnetic or ferromagnetic tape; coating the flexible substrate with a magnetic or ferromagnetic polymer; coating the flexible substrate with a magnetic or ferromagnetic elastomer; coating the flexible substrate with a magnetic or ferromagnetic plastic; coating the flexible substrate in a magnetic or ferromagnetic solder resist layer; coating the flexible substrate in a magnetic or ferromagnetic solder mask; coating the flexible substrate in a magnetic or ferromagnetic solder stop mask; or coating the flexible substrate in a magnetic or ferromagnetic lacquer.

In accordance with another embodiment of method 500, the process further includes electrically coupling the leads of the electrical device with the one or more electrical interconnects fabricated into the flexible substrate while the flexible substrate remains held flat against the carrier plate by the magnetic attraction between the carrier plate and the flexible substrate.

In accordance with another embodiment of method 500, the flexible substrate for the electrical device includes a compliant and stretchable dielectric material substrate having a plurality of stretchable electrical interconnects integrated therein as the one or more electrical interconnects; in which the stretchable electrical interconnects electrically couple the electrical device with one or more electrical components via the one or more stretchable electrical interconnects; and in which the stretchable electrical interconnects provide an electrical and communications interface between the electrical device and the one or more electrical components through the dielectric material.

In accordance with another embodiment of method 500, supporting the flexible substrate with the carrier plate during the one or more manufacturing processes for the flexible substrate includes: attaching the electrical device to the flexible substrate, in which the electrical device includes an integrated circuit, a processor, a die, or a central processor unit (CPU); attaching one or more electrical components to the flexible substrate, in which the one or more electrical components include any one of: a battery, a sensor, a transceiver, a memory, and a system on a chip (SOC); and electrically interfacing the electrical device attached to the flexible substrate with the one or more electrical components attached to the flexible substrate while the flexible substrate remains held flat against the carrier plate by the attractive magnetic force.

In accordance with another embodiment of method 500, the flexible substrate and electrical device includes a module package including at least a microelectronic die embedded in a processor and a memory and one or more communication circuits.

In accordance with another embodiment of method 500, the flexible substrate includes an uncured elastomer including an elastomer mix and FeO (ferrous oxide) particles which respond to stimuli of a magnetic field; in which the method further includes: curing the elastomer mix and FeO particles forming the flexible substrate; and electrically coupling the leads of the electrical device with the one or more electrical interconnects fabricated into the flexible substrate subsequent to curing the elastomer mix and FeO particles, in which the flexible substrate is held flat against the carrier plate by an attractive magnetic force between the FeO particles cured into the flexible substrate and the complementary magnetic attraction of the carrier plate.

In accordance with another embodiment of method 500, the flexible substrate includes a compliant and stretchable substrate for the electrical device and one or more electrically connected electrical components, sensors, or functional modules; in which the stretchable substrate includes at least one of a stretchable polydimethylsiloxane (PDMS) substrate, a stretchable Polyisoprene substrate, a stretchable polybutadiene substrate, a stretchable polyisobutylene substrate, a stretchable polyurethanes substrate, a stretchable thermoplasticpolyurethanes substrate, a stretchable butyl rubber substrate, a stretchable nitrile rubber substrate, or a stretchable woven fabric substrate.

In accordance with another embodiment of method 500, the flexible substrate includes one of: a flex circuit; a flexible plastic substrate; a stretchable electronic substrate; a stretchable dielectric material; a compliant, bendable, or flexible dielectric substrate; a polyimide substrate; a PolyEther Ether Ketone (PEEK) substrate; a PolyDiMethylSiloxane (PDMS) substrate; a Flexible Printed Circuit (FPC) substrate; a photolithographic exposed substrate; a flexible foil circuit and substrate; a Flexible Flat Cable (FFC) substrate; a copper strip laminated between two layers of Polyethylene terephthalate (PETE) and coated by a thermosetting adhesive; a silicon-based organic polymer substrate; and a screen printed silver circuits on polyester substrate.

In accordance with another embodiment of method 500, the carrier plate is magnetic and the flexible substrate is ferromagnetic.

In accordance with another embodiment of method 500, the carrier plate is magnetic and the flexible substrate is magnetic.

In accordance with another embodiment of method 500, the carrier plate is ferromagnetic and the flexible substrate is magnetic.

In accordance with another embodiment of method 500, the carrier plate is an electromagnetic carrier plate and the flexible substrate is magnetic or ferromagnetic and further in which the flexible substrate is held flat against the carrier plate by an attractive magnetic force between the flexible substrate and a complementary magnetic attraction of the electromagnetic carrier plate while the electromagnetic carrier plate is energized by an electrical input source.

In accordance with another embodiment of method 500, supporting the flexible substrate with the carrier plate during one or more manufacturing processes for the flexible substrate includes applying the one or more manufacturing processes to the flexible substrate held to the carrier plate by magnetic attraction without the use of a top plate, without the use of a cover plate, without the use of mechanical clips, without the use of mechanical clamps, without the use of adhesive tape binding the flexible substrate to the carrier plate; and without the use of discardable flanges.

In accordance with another embodiment of method 500, removing the flexible substrate from the carrier plate subsequent to completion of the one or more manufacturing processes for the flexible substrate includes one of: sliding the flexible substrate off of the carrier plate; peeling the flexible substrate off of the carrier plate; or terminating an electromagnetic attraction of the carrier plate by removing an electrical power source to the carrier plate functioning as an electromagnetic carrier plate and lifting the flexible substrate off of the carrier plate.

In accordance with another embodiment of method 500, the carrier plate includes a magnetic carrier plate; and in which removing the flexible substrate from the carrier plate subsequent to completion of the one or more manufacturing processes for the flexible substrate includes heating or cooling the carrier plate to attain a specified magnetic force for the removal of the flexible substrate from the magnetic carrier plate and removing the flexible substrate from the magnetic carrier plate when the specified magnetic force is attained.

In accordance with another embodiment of method 500, the carrier plate includes an electromagnetic carrier plate; and in which removing the flexible substrate from the carrier plate subsequent to completion of the one or more manufacturing processes for the flexible substrate includes varying an electromagnetic attractive force of the electromagnetic carrier plate by increasing or decreasing an electrical input to the electromagnetic carrier plate to attain a specified electromagnetic force for the removal of the flexible substrate from the magnetic carrier plate and removing the flexible substrate from the electromagnetic carrier plate when the specified electromagnetic force is attained.

In accordance with another embodiment of method 500, the process further includes: assembling the flexible substrate into a consumer product, in which the consumer product includes one of: a clothing item; sports attire; a shoe; a watch; a ring; a bracelet; a wearable technology to be worn as a clothing item or an accessory; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

Figure 6:
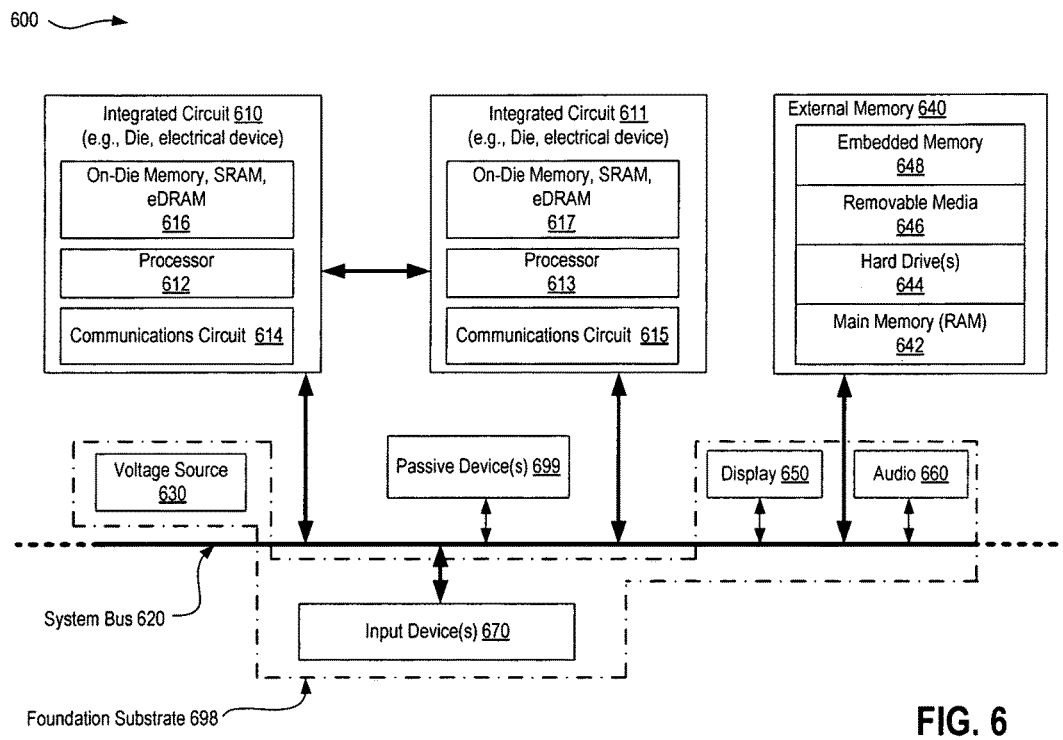
FIG. 6 is a schematic of a computer system, in accordance with an embodiment of the present invention.

FIG. 6 is a schematic of a computer system 600, in accordance with an embodiment of the present invention. The computer system 600 (also referred to as the electronic system 600) as depicted can embody a magnetic particle embedded flexible substrate, a printed flexible substrate for a magnetic tray, or an electro-magnetic carrier for magnetized or ferromagnetic flexible substrates, according to any of the several disclosed embodiments and their equivalents as set forth in this disclosure. The computer system 600 may be a mobile device such as a net-book computer. The computer system 600 may be a mobile device such as a wireless smart phone or tablet. The computer system 600 may be a desktop computer. The computer system 600 may be a hand-held reader. The computer system 600 may be a server system. The computer system 600 may be a supercomputer or high-performance computing system.

In accordance with one embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

Such an integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes, or is coupled with, electrical devices having a magnetic particle embedded flexible substrate, a printed flexible substrate for a magnetic tray, or an electro-magnetic carrier for magnetized or ferromagnetic flexible substrates, as disclosed herein.

In accordance with one embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In accordance with one embodiment, the integrated circuit 610 is complemented with a subsequent integrated circuit 611. Useful embodiments include a dual processor 613 and a dual communications circuit 615 and dual on-die memory 617 such as SRAM. In accordance with one embodiment, the dual integrated circuit 610 includes embedded on-die memory 617 such as eDRAM.

In one embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

In accordance with one embodiment, the electronic system 600 also includes a display device 650 and an audio output 660. In one embodiment, the electronic system 600 includes an input device 670 such as a controller that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a package substrate having a magnetic particle embedded flexible substrate, a printed flexible substrate for a magnetic tray, or an electro-magnetic carrier for magnetized or ferromagnetic flexible substrates, according to any of the several disclosed embodiments and their equivalents, an electronic system, a computer system, one or more methods of fabricating an integrated circuit, and one or more methods of fabricating an electronic assembly that includes a package substrate having a magnetic particle embedded flexible substrate, a printed flexible substrate for a magnetic tray, or an electro-magnetic carrier for magnetized or ferromagnetic flexible substrates, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a magnetic particle embedded flexible substrate, a printed flexible substrate for a magnetic tray, or an electro-magnetic carrier for magnetized or ferromagnetic flexible substrates embodiments and their equivalents. A foundation substrate 698 may be included, as represented by the dashed line of FIG. 6. Passive devices 699 may also be included, as is also depicted in FIG. 6.

In accordance with a particular embodiment, there is a flexible substrate including: an electrical device affixed to the flexible substrate; one or more electrical interconnects electrically coupled with leads of the electrical device; one or more electrical components electrically coupled with the electrical device via the one or more electrical interconnects; in which the flexible substrate lacks sufficient rigidity and biaxial strength to hold its shape within a horizontal plane when unsupported; and magnetic particles or ferromagnetic particles integrated with the flexible substrate, the flexible substrate having undergone one or more manufacturing processes while held flat against a carrier plate by an attractive magnetic force between the magnetic particles or ferromagnetic particles integrated with the flexible substrate and a complementary magnetic attraction of the carrier plate, in which the carrier plate supported the flexible substrate during one or more manufacturing processes for the flexible substrate.

In accordance with another embodiment of the flexible substrate, the magnetic particles or ferromagnetic particles integrated with the flexible substrate are: painted onto the flexible substrate; printed onto the flexible substrate; coated onto the flexible substrate; or mixed and cured within the flexible substrate.

In accordance with another embodiment of the flexible substrate, the apparatus is embodied within one of: a clothing item; sports attire; a shoe; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

In accordance with a particular embodiment, there is a wearable technology to be worn as a clothing item or an accessory, the wearable technology including: an electrical device affixed to a flexible substrate; one or more electrical interconnects within the flexible substrate electrically coupled with leads of the electrical device; one or more electrical components affixed to the flexible substrate and electrically coupled with the electrical device via the one or more electrical interconnects; in which the flexible substrate lacks sufficient rigidity and biaxial strength to hold its shape within a horizontal plane when unsupported; and magnetic particles or ferromagnetic particles integrated with the flex-ible substrate, the flexible substrate having undergone one or more manufacturing processes while held flat against a carrier plate by an attractive magnetic force between the magnetic particles or ferromagnetic particles integrated with the flexible substrate and a complementary magnetic attraction of the carrier plate, in which the carrier plate supported the flexible substrate during one or more manufacturing processes for the flexible substrate.

In accordance with another embodiment of the wearable technology, the wearable technology further includes a magnetic coupler, clasp, or latch held closed through attractive magnetic forces between the magnetic coupler, clasp, or latch and the flexible substrate having magnetic filler particles integrated therewith during a process of manufacture of the flexible substrate.

In accordance with another embodiment of the wearable technology, the wearable technology is embodied within one of: a clothing item; sports attire; a shoe; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

What is claimed is:

1. A method comprising:
   fabricating a flexible substrate having one or more electrical interconnects to couple with leads of an electrical device;
   integrating particles with the flexible substrate, wherein the particles comprise a non-magnetic ferrous material;
   supporting the flexible substrate with a carrier plate during one or more manufacturing processes for the flexible substrate, wherein the carrier plate is a magnetic carrier plate, and wherein the flexible substrate is held flat against the carrier plate by an attractive magnetic force between the particles integrated with the flexible substrate and a complementary magnetic attraction of the carrier plate; and
   removing the flexible substrate from the carrier plate subsequent to completion of the one or more manufacturing processes for the flexible substrate.

2. The method of claim 1, wherein supporting the flexible substrate with the carrier plate during the one or more manufacturing processes for the flexible substrate comprises:
   supporting the flexible substrate with the carrier plate during one or more of assembly processing operations, semi-conductor manufacturing processes, substrate manufacturing processes, or flexible substrate thermal curing processes, flexible substrate build-up and lamination processes, flexible substrate soldering processes, and flexible substrate functional testing processes.

3. The method of claim 1, wherein the flexible substrate for the electrical device lacks sufficient rigidity and biaxial strength to hold its shape within a horizontal plane when unsupported by the carrier plate.

4. The method of claim 1, wherein the flexible substrate for the electrical device is sufficiently thin that it does not maintain its shape within a horizontal plane when removed from the carrier plate.

5. The method of claim 1, wherein particles with the flexible substrate comprises one of:
 integrating adhesives between laminates of the fabricated flexible substrate;
 integrating laminates into the fabricated flexible substrate;
 integrating sheets into the fabricated flexible substrate;
 integrating filler particles into the fabricated flexible substrate;
 integrating tape into the fabricated flexible substrate;
 integrating ceramics into the fabricated flexible substrate; or
 integrating tabs, strips, or buttons into the fabricated flexible substrate.

6. The method of claim 1, wherein integrating particles with the flexible substrate comprises one of:
 printing ink onto the flexible substrate, the ink comprising the particles;
 painting the flexible substrate with paint, the paint comprising the particles;
 coating the flexible substrate with a laminate, the laminate comprising the particles;
 coating the flexible substrate with a adhesive, the adhesive comprising the particles;
 coating the flexible substrate with a tape, the tape comprising the particles;
 coating the flexible substrate with a polymer, the polymer comprising the particles;
 coating the flexible substrate with a elastomer, the elastomer comprising the particles;
 coating the flexible substrate with a plastic, the plastic comprising the particles;
 coating the flexible substrate in a solder resist layer, the solder resist layer comprising the particles;
 coating the flexible substrate in a solder mask, the solder mask comprising the particles;
 coating the flexible substrate in a solder stop mask, the solder stop mask comprising the particles; or
 coating the flexible substrate in a lacquer, the lacquer comprising the particles.

7. The method of claim 1, further comprising:
 electrically coupling the leads of the electrical device with the one or more electrical interconnects fabricated into the flexible substrate while the flexible substrate remains held flat against the carrier plate by the magnetic attraction between the carrier plate and the flexible substrate.

8. The method of claim 7:
 wherein the flexible substrate for the electrical device comprises a compliant and stretchable dielectric material substrate having a plurality of stretchable electrical interconnects integrated therein as the one or more electrical interconnects;
 wherein the stretchable electrical interconnects electrically couple the electrical device with one or more electrical components via the one or more stretchable electrical interconnects; and
 wherein the stretchable electrical interconnects provide an electrical and communications interface between the electrical device and the one or more electrical components through the dielectric material.

9. The method of claim 1, wherein supporting the flexible substrate with the carrier plate during the one or more manufacturing processes for the flexible substrate comprises:
 attaching the electrical device to the flexible substrate, wherein the electrical device comprises an integrated circuit, a processor, a die, or a central processor unit (CPU);
 attaching one or more electrical components to the flexible substrate, wherein the one or more electrical components comprise any one of:
  a battery, a sensor, a transceiver, a memory, and a system on a chip (SOC); and
  electrically interfacing the electrical device attached to the flexible substrate with the one or more electrical components attached to the flexible substrate while the flexible substrate remains held flat against the carrier plate by the attractive magnetic force.

10. The method of claim 1, wherein the flexible substrate and electrical device comprises a module package comprising at least a microelectronic die embedded in a processor and a memory and one or more communication circuits.

11. The method of claim 1:
 wherein the flexible substrate comprises an uncured elastomer comprising an elastomer mix and ferrous particles which respond to stimuli of a magnetic field;
 wherein the method further comprises:
 curing the elastomer mix and ferrous particles forming the flexible substrate; and electrically coupling the leads of the electrical device with the one or more electrical interconnects fabricated into the flexible substrate subsequent to curing the elastomer mix and ferrous particles, wherein the flexible substrate is held flat against the carrier plate by an attractive magnetic force between the ferrous particles cured into the flexible substrate and the complementary magnetic attraction of the carrier plate.

12. The method of claim 1:
 wherein the flexible substrate comprises a compliant and stretchable substrate for the electrical device and one or more electrically connected electrical components, sensors, or functional modules;
 wherein the stretchable substrate comprises at least one of a stretchable polydimethylsiloxane (PDMS) substrate, a stretchable Polyisoprene substrate, a stretchable polybutadiene substrate, a stretchable polyisobutylene substrate, a stretchable polyurethanes substrate, a stretchable thermoplasticpolyurethanes substrate, a stretchable butyl rubber substrate, a stretchable nitrile rubber substrate, or a stretchable woven fabric substrate.

13. The method of claim 1, wherein the flexible substrate comprises one of:
 a flex circuit;
 a flexible plastic substrate;
 a stretchable electronic substrate;
 a stretchable dielectric material;
 a compliant, bendable, or flexible dielectric substrate;
 a polyimide substrate;
 a PolyEther Ether Ketone (PEEK) substrate;
 a PolyDiMethylSiloxane(PDMS) substrate;
 a Flexible Printed Circuit (FPC) substrate;
 a photolithographic exposed substrate;

a flexible foil circuit and substrate;
a Flexible Flat Cable (FFC) substrate;
a copper strip laminated between two layers of Polyethylene terephthalate (PETE) and coated by a thermosetting adhesive;
a silicon-based organic polymer substrate; and
a screen printed silver circuits on polyester substrate.

14. The method of claim 1, wherein supporting the flexible substrate with the carrier plate during one or more manufacturing processes for the flexible substrate comprises applying the one or more manufacturing processes to the flexible substrate held to the carrier plate by magnetic attraction without the use of a top plate, without the use of a cover plate, without the use of mechanical clips, without the use of mechanical clamps, without the use of adhesive tape binding the flexible substrate to the carrier plate; and without the use of discardable flanges.

15. The method of claim 1, wherein removing the flexible substrate from the carrier plate subsequent to completion of the one or more manufacturing processes for the flexible substrate comprises one of:
    sliding the flexible substrate off of the carrier plate;
    peeling the flexible substrate off of the carrier plate; or
    terminating an electromagnetic attraction of the carrier plate by removing an electrical power source to the carrier plate functioning as an electromagnetic carrier plate and lifting the flexible substrate off of the carrier plate.

16. The method of claim 1:
wherein removing the flexible substrate from the carrier plate subsequent to completion of the one or more manufacturing processes for the flexible substrate comprises heating or cooling the carrier plate to attain a specified magnetic force for the removal of the flexible substrate from the magnetic carrier plate and removing the flexible substrate from the magnetic carrier plate when the specified magnetic force is attained.

17. The method of claim 1:
wherein removing the flexible substrate from the carrier plate subsequent to completion of the one or more manufacturing processes for the flexible substrate comprises varying an electromagnetic attractive force of the electromagnetic carrier plate by increasing or decreasing an electrical input to the electromagnetic carrier plate to attain a specified electromagnetic force for the removal of the flexible substrate from the magnetic carrier plate and removing the flexible substrate from the electromagnetic carrier plate when the specified electromagnetic force is attained.

18. The method of claim 1, further comprising:
assembling the flexible substrate into a consumer product,
    wherein the consumer product comprises one of:
    a clothing item;
    sports attire;
    a shoe;
    a watch;
    a ring;
    a bracelet;
    a wearable technology to be worn as a clothing item or an accessory;
    fashion electronics to be worn as a clothing item or an accessory;
    tech togs to be worn as a clothing item or an accessory;
    fashionable technology to be worn as a clothing item or an accessory; or
    a flexible wearable technology to be worn as a clothing item or an accessory.

* * * * *